(12) United States Patent
Egawa

(10) Patent No.: US 6,275,115 B1
(45) Date of Patent: Aug. 14, 2001

(54) PLL CIRCUIT HAVING CURRENT CONTROL OSCILLATOR RECEIVING THE SUM OF TWO CONTROL CURRENTS

(75) Inventor: Kanji Egawa, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/515,324

(22) Filed: Feb. 29, 2000

(30) Foreign Application Priority Data

Mar. 1, 1999 (JP) .................................................. 11-052696

(51) Int. Cl.$^7$ ........................... H03L 7/085; H03L 7/099; H03L 7/10
(52) U.S. Cl. .................................. 331/11; 331/17; 331/25
(58) Field of Search .................................. 331/11, 17, 25

(56) References Cited

U.S. PATENT DOCUMENTS 5,382,922 * 1/1995 Gersbach et al. ..................... 331/1 A
5,384,502 * 1/1995 Volk ......................................... 331/17
5,459,653 * 10/1995 Seto et al. .............................. 363/73
5,504,459   4/1996 Gersbach et al. ..................... 331/17

FOREIGN PATENT DOCUMENTS 3-206726   9/1991 (JP) .

* cited by examiner

Primary Examiner—Siegfried H. Grimm
(74) Attorney, Agent, or Firm—Oblon, Spivak, McClelland, Maier & Neustadt, P.C.

(57) ABSTRACT

A PLL circuit includes: a phase comparator for comparing the phase of an input signal with the phase of a reference input signal to output a signal according to the phase difference therebetween; a low pass filter for outputting a low frequency control voltage on the basis of the output of the phase comparator; a voltage control oscillator for controlling an oscillating frequency on the basis of the control voltage; and a characteristic control part for controlling the characteristic of oscillating frequency to control voltage of the voltage control oscillator on the basis of n+1 ranges of first through n+1-th ranges obtained by dividing a variable range of the control voltage by first through n-th ($n \geq 2$) thresholds which are different from each other. Thus, it is possible to widen the operating frequency range, and it is possible to inhibit the frequency variation due to noises.

6 Claims, 6 Drawing Sheets

PLL CIRCUIT HAVING CURRENT CONTROL OSCILLATOR RECEIVING THE SUM OF TWO CONTROL CURRENTS

BACKGROUND OF THE INVENTION

1. Field of The Invention

The present invention relates generally to a PLL circuit.

2. Description of The Prior Art

Typically, a PLL circuit comprises: a phase comparator for comparing the phase of a reference input clock signal $F_{ref}$, which is supplied from the outside, with the phase of an internal clock signal $F_{vco}$ to output a phase difference signal; a loop filter for receiving the phase difference signal to output a control voltage $V_{cnt}$; and a voltage control oscillator for outputting the internal clock signal synchronized with the reference input clock signal in accordance with the control voltage $V_{cnt}$.

In such a conventional PLL circuit, the output (oscillating frequency) $F_{vco}$ of a voltage control oscillator varies in accordance with the control voltage $V_{cnt}$ outputted from the loop filter. In order to remedy the irregularity in process for the PLL circuit to enhance the product yield, the variable range (operating frequency range) of the oscillating frequency $F_{vco}$, of the voltage control oscillator is desired to be wider. In order to increase the variable range of the oscillating frequency $F_{cnt}$, it is required to enhance the gain of the voltage control oscillator. In this case, the variation in the oscillating frequency $F_{vco}$ to the unit variation in the control voltage $V_{cnt}$ increases, so that there is a problem in that the frequency variation due to noises increases.

SUMMARY OF THE INVENTION

It is therefore an object of the present invention to eliminate the aforementioned problems and to provide a PLL circuit capable of extending the operating frequency range and of controlling the frequency variation due to noises.

In order to accomplish the aforementioned and other objects, according to one aspect of the present invention, a PLL circuit comprises: a phase comparator for comparing the phase of an input signal with the phase of a reference input signal to output a signal according to the phase difference therebetween; a low pass filter for outputting a low frequency control voltage on the basis of the output of the phase comparator; a voltage control oscillator for controlling ani oscillating frequency on the basis of the control voltage; and a characteristic control part for controlling the characteristic of oscillating frequency to control voltage of the voltage control oscillator on the basis of n+1 ranges of first through n+1-th ranges obtained by dividing a variable range of the control voltage by first through n-th (n≧2) thresholds which are different from each other.

The characteristic control part preferably comprises: a voltage comparator for determining which range of the first through n+1-th ranges the control voltage belongs to, by comparing the control voltage with the first through n-th thresholds; and an additional current generating part for generating an additional current on the basis of the output of the voltage comparator, wherein the characteristic of the voltage control oscillator is controlled on the basis of the additional current.

The voltage control oscillator preferably comprises: a voltage-to-current converter for converting the control to a current; and a current control oscillator for controlling the oscillating frequency on the basis of the sum of the output of the voltage-to-current converter and the additional current.

The number n of the thresholds may be 2, the first threshold may be lower than the second threshold, and the voltage comparator may perform the analog-to-digital conversion of the output of the low pass filter, the voltage comparator outputting a signal having a value of "−1" when the AD converted control voltage is lower than the first threshold and belongs to the first range, a signal having a value of "0" when the AD converted control voltage is not lower than the first threshold and lower than the second threshold and belongs to the second range, and a signal having a value of "1" when the AD converted control voltage is higher than the second threshold and belongs to the third range.

The additional current generating part may have a memory for adding the output of the voltage comparator to a value stored therein, to update the added result to output the updated value as a code, the additional current generating part generating the additional current on the basis of the code outputted from the memory.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, a preferred embodiment of a PLL circuit according to the present invention will be described below.

Figure 1:
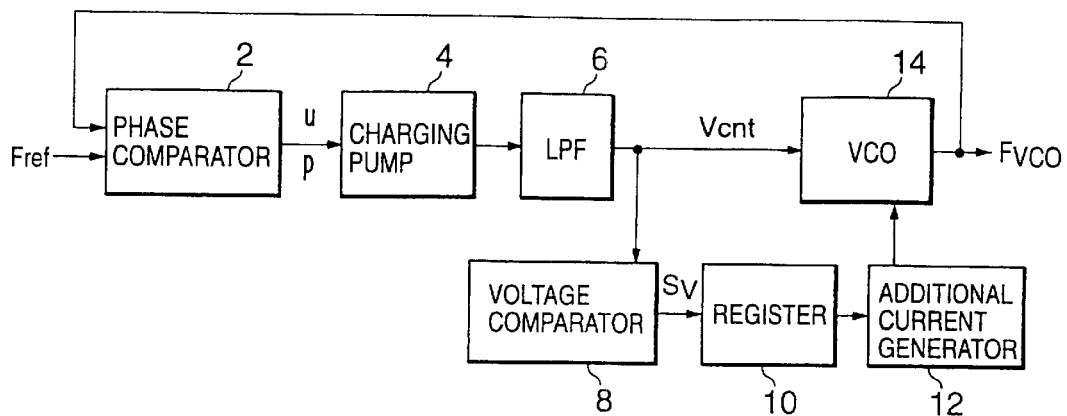
FIG. 1 is a block diagram of a preferred embodiment of a PLL circuit according to the present invention.

FIG. 1 shows a preferred embodiment of a PLL circuit according to the present invention. In this preferred embodiment, the PLL circuit comprises a phase comparator 2, a charging pump 4, a low pass filter (which will be also hereinafter referred to as a "LPF") 6, a voltage comparator 8, a register 10, an additional current generator 12, and a voltage control oscillator (which will be also hereinafter referred to as a "VCO") 14.

The phase comparator 2 compares the phase of a clock input $F_{vco}$ with the phase of a reference clock input $F_{ref}$ to output two outputs u, d in accordance with the phase difference therebetween. For example, when the phase of the clock input $F_{vco}$ lags behind the phase of the reference clock input $F_{ref}$, the output u is "1" and output d is "0" while there is a phase difference. When the phase of the clock input $F_{vco}$ is in advance of the phase of the reference clock input $F_{ref}$, the output u is "0" and output d is "1" while there is a phase difference. When the phase difference is zero, each of the two outputs u, d is zero.

Figure 3:
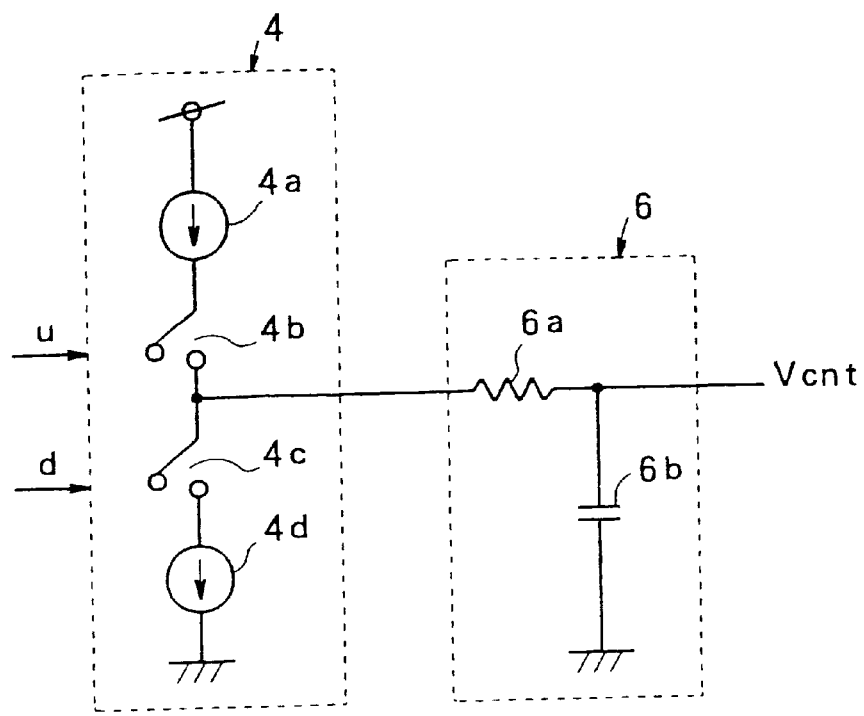
FIG. 3 is a circuit diagram showing an example of a charging pump and a low pass filter.

The charging pump 4 outputs a voltage signal according to the phase difference on the basis of the two outputs u, d of the phase comparator 2. Then, the low pass filter 6 damps the high frequency component of the charging pump 4. The concrete constructions of the charging pump 4 and low pass filter 6 are shown in FIG. 3. In FIG. 3, the charging pump 4 comprises a constant current source 4a, switches 4b, 4c and a constant current source 4d. The low pass filter 6 comprises a resistor 6a and a capacitor 6b. The switch 4b is "closed" when the signal u is "1", and "open" when the signal u is "0". The switch 4c is "closed" when the signal d is "1", and "open" when the signal d is "0". Therefore, when the phase of the clock signal $F_{vco}$ lags behind the phase of the reference clock signal $F_{ref}$, i.e., when the signal u is "1" and the signal d is "0", the switch 4b is closed, so that the output voltage $V_{cnt}$ of the low pass filter 6 increases. On the other hand, when the phase of the clock signal $F_{vco}$ is in advance of the phase of the reference clock signal $F_{ref}$, i.e., when the signal u is "0" and the signal d is "1", the switch 4c is closed, so that the output voltage $V_{cnt}$ of the low pass filter 6 decreases.

Figure 4:
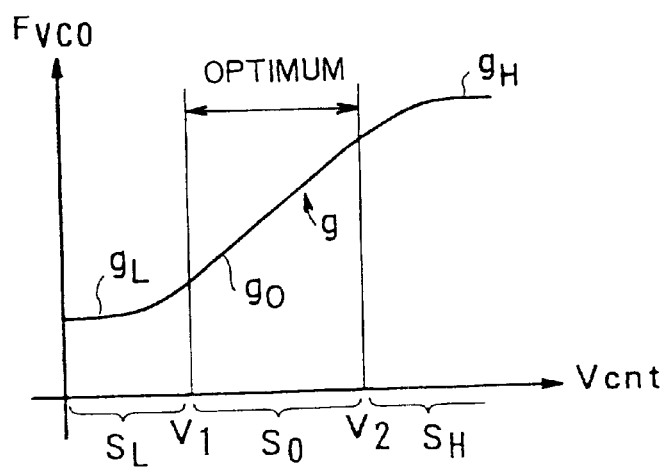
FIG. 4 is a graph showing the F-V characteristic of a voltage control oscillator.

The voltage comparator 8 performs the analog-to-digital conversion of the output $V_{cnt}$ of the low pass filter 6, determines which range of three ranges $S_0$, $S_1$, and S2 shown in FIG. 4 the converted value belongs to, and outputs an output signal $S_v$ in accordance with the determined results. IN FIG. 4, a graph g shows the F-V characteristic of the voltage control oscillator, and comprises a linear portion $g_0$ and two non-linear portions $g_L$, $g_H$. The above described range $S_0$, corresponds to the control voltage $V_{cnt}$ in the linear portion $g_0$ of the characteristic graph g, and is the optimum range when oscillation is carried out. In this range $S_0$, an optional voltage $V_0$ is higher than a threshold $V_1$ ($V_0 \geq V_1$), and lower than a threshold $V_2$ ($V_0 \leq V_2$). On the other hand, the range $S_L$ corresponds to the control voltage $V_{cnt}$ in the non-linear portion $g_L$ of the characteristic graph g. In this range $S_L$, an optional value $V_L$ is lower than the threshold $V_1$, ($V_L < V_1$). In addition, the range $S_H$ corresponds to the control voltage $V_{cnt}$ of the non-linear portion $g_H$ of the characteristic graph g. In this range $S_H$, an optional value $V_H$ is higher than the threshold $V_2$ ($V_H > V_2$).

Then, the output signal $S_v$ is "0" when the AD-converted value of the control voltage $V_{cnt}$ is within the range $S_0$, "1" when it is within the range $S_H$, and "−1" when it is within the range $S_L$.

The register 10 adds the output $S_v$ of the voltage comparator 8 to a stored value to update the added result to transmit the updated value to the additional current generator 12 as a code.

The additional current generator 12 outputs an additional current $I_{dac}$ on the basis of the code outputted from the register 10.

Figure 2:
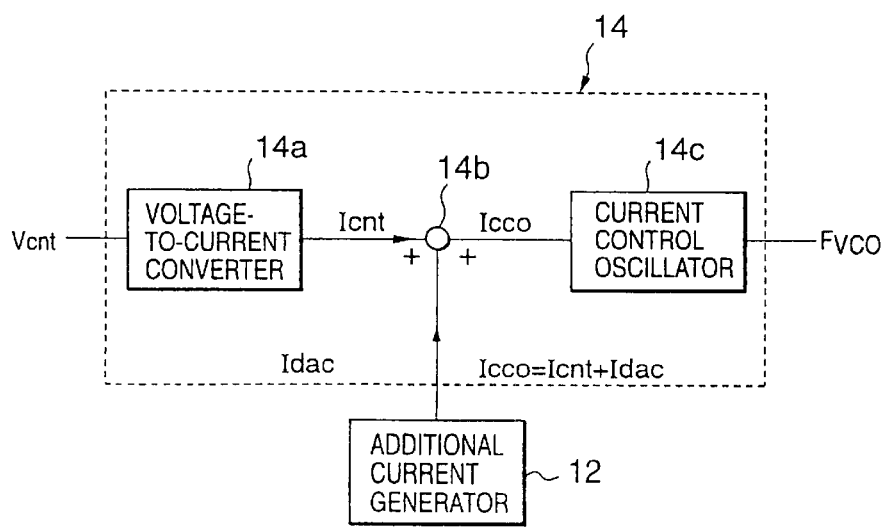
FIG. 2 is a block diagram showing an example of a voltage control oscillator according to the present invention.

The voltage control oscillator 14 outputs an oscillating frequency signal $F_{vco}$ on the basis of the control voltage $V_{cnt}$, which is outputted from the low pass filter 6, and the additional current $I_{dac}$ which is outputted from the additional current generator 12. As shown in FIG. 2, the voltage control oscillator 14 comprises a voltage-to-current converter 14a, an adder 14b, and a current control oscillator 14c. The voltage-to-current converter 14a outputs a current $I_{cnt}$ in proportion to the control voltage $V_{cnt}$. The adder 14b adds the output $I_{cnt}$ of the voltage-to-current converter 14a to the output $I_{dac}$ of the additional current generator 12 and inputs the added result $I_{cco}$ to the current control oscillator 14c. The current control oscillator 14c outputs an oscillating frequency signal on the basis of the output of the adder 14b.

Figure 5:
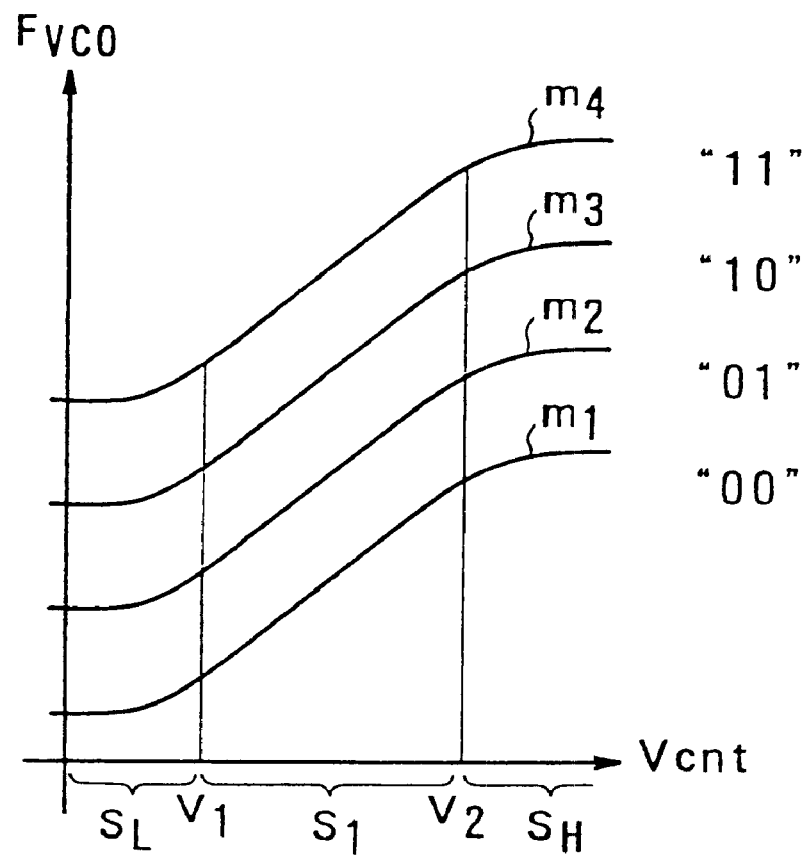
FIG. 5 is a graph showing the F-V characteristic of a voltage control oscillator according to the present invention.

For example, FIG. 5 shows the variation in F-V characteristic in this preferred embodiment, which shows the relationship between the control voltage $V_{cnt}$ and the oscillating frequency $F_{vco}$ when the codes outputted from the register 10 are expressed as "00", "01", "10" and "11" by 2 bits to be used as parameters. When the codes are expressed as "00", "01", "10" and "11", the F-V characteristics are shown by graphs $m_1$, $m_2$, $m_3$ and $m_4$, respectively. As can be seen from FIG. 5, the characteristic graph translates to a higher frequency region as the value of the code increases.

Figure 6:
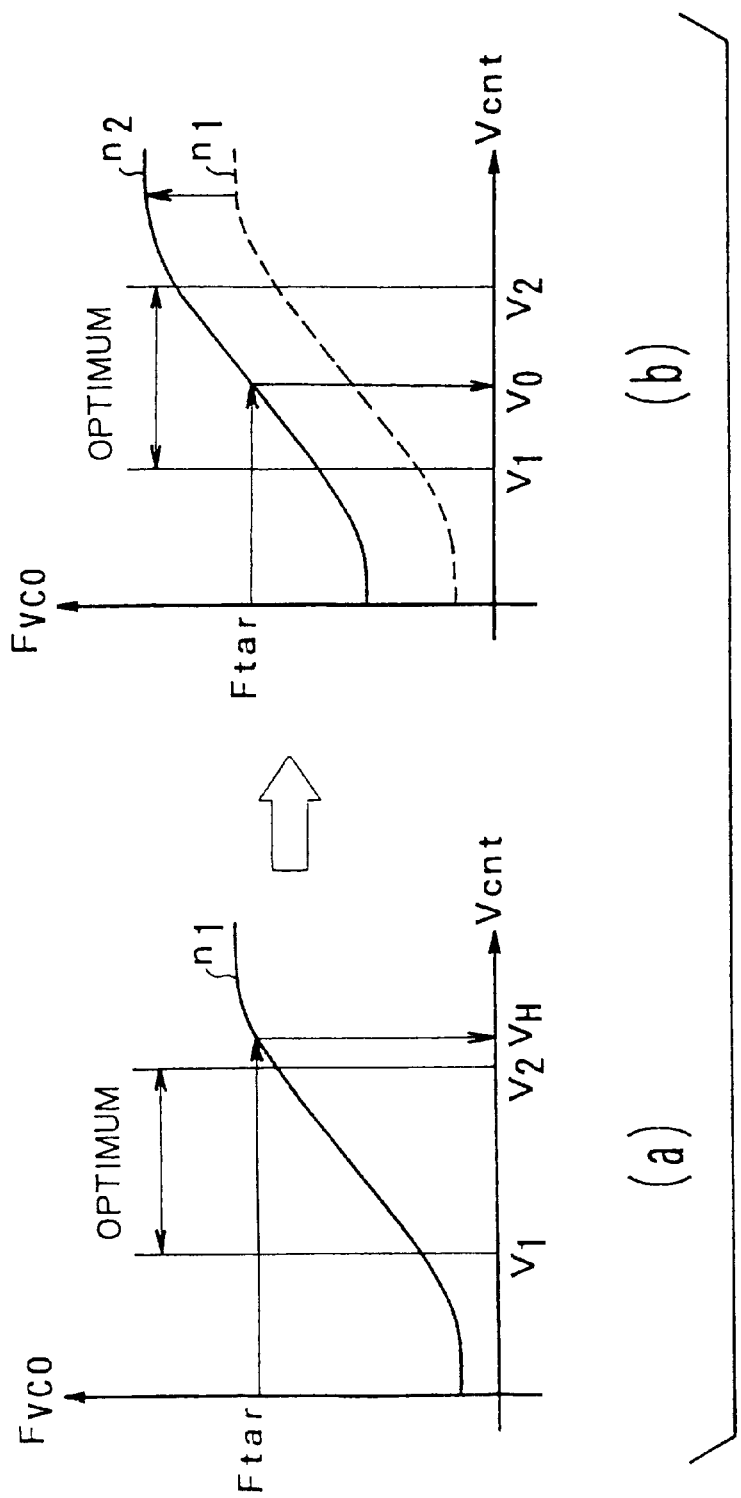
FIG. 6 is an illustration for explaining the operation of the preferred embodiment shown in FIG. 1.
Figure 7:
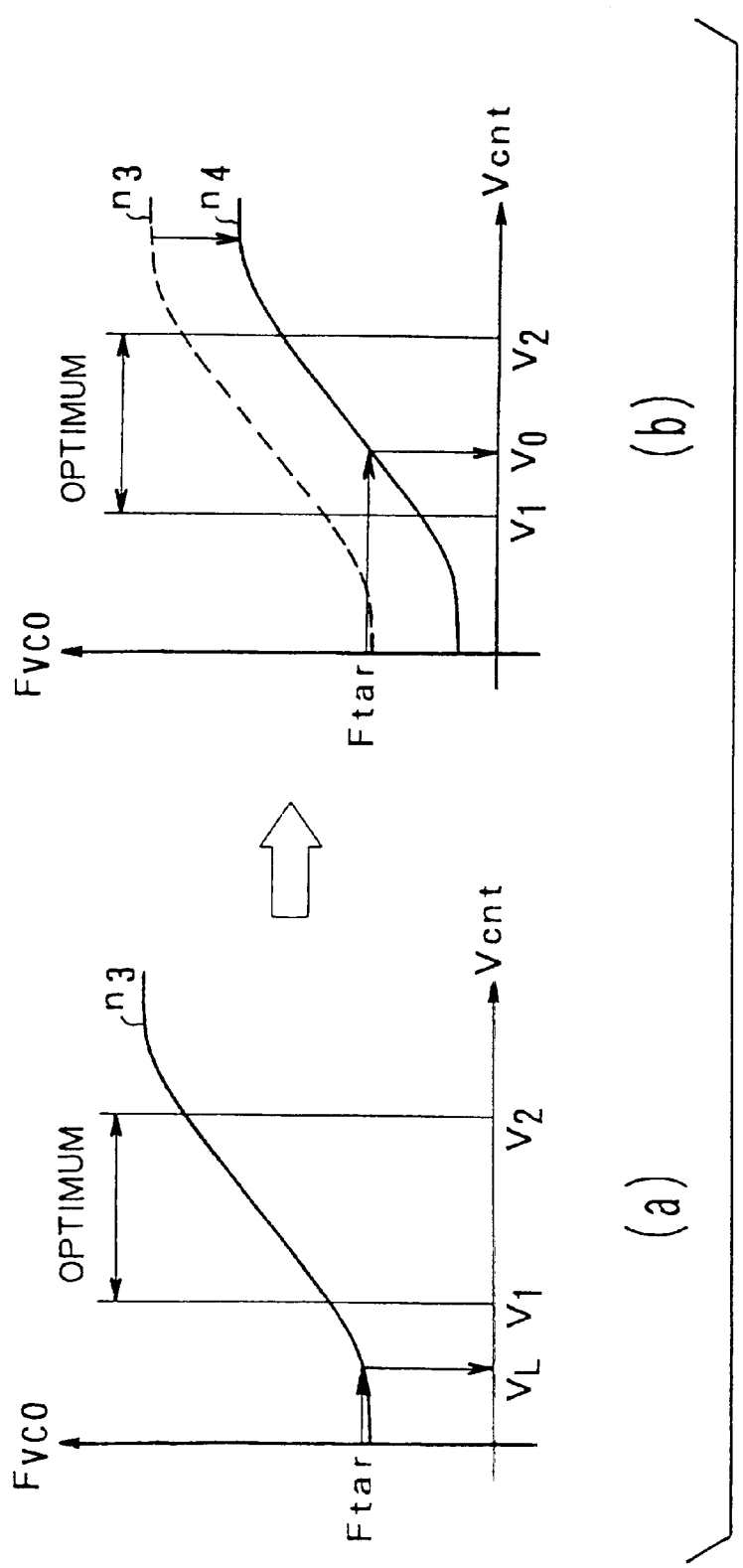
FIG. 7 is an illustration for explaining the operation of the preferred embodiment shown in FIG. 1.

Referring to FIGS. 6 and 7, the operation of the PLL circuit in this preferred embodiment will be described below.

Considering a case where the control voltage $V_H$ corresponding to a target frequency (a target value of the voltage control oscillator 14) $F_{tar}$ is higher than the threshold $V_2$ when the F-V characteristic of the voltage control oscillator 14 is a graph $n_1$ shown in FIG. 6(a). In this case, the control voltage $V_H$ is within a range (the range $S_H$ shown in FIG. 4) which is shifted from the optimum range (the linear portion of the characteristic graph). At this time, the control voltage $V_{cnt}$ outputted from the low pass filter 6 is $V_H$. Then, the voltage comparator 8 compares the control voltage $V_{cnt}$ with the thresholds $V_2$, $V_1$ in the optimum range to determine that the control voltage $V_{cnt}$ is within the range $S_H$ shown in FIG. 4. Thus, the voltage comparator 8 outputs a signal $S_v$ having a value of "1". This value is added to the last value stored in the register 10 to be updated. Since the updated value is greater than the last value, the additional current $I_{dac}$ outputted from the additional current generator 12 increases. Therefore, the current $I_{cco}$ inputted to the current control oscillator 14c also increases, so that the frequency signal $F_{cvo}$ serving as the output of the current control oscillator 14c also increases. This means that the F-V characteristic of the voltage control oscillator 14 varies from the graph $n_1$ to a graph $n_2$ as shown in FIG. 6(b). Thus, the control voltage $V_{cnt}$ corresponding to the target frequency $F_{tar}$ increases. The above described operation is repeated until the control voltage $V_{cnt}$ enters the optimum oscillation range (the range $S_0$ shown in FIG. 4). Finally, the control voltage $V_{cnt}$ is stable when it reaches the optimum oscillation range.

Contrary to the above described case, considering a case where the control voltage $V_L$ corresponding to the target frequency $F_{tar}$ is lower than the threshold $V_1$ when the F-V characteristic of the voltage control oscillator 14 is a graph $n_3$ shown in FIG. 7(a). In this case, the control voltage $V_L$ is within a range $S_L$ which is shifted from the optimum range $S_O$. At this time, the control voltage $V_{cnt}$ outputted from the low pass filter 6 is $V_L$. Then, the voltage comparator 8 compares the control voltage $V_{cnt}$ with the thresholds $V_1$, $V_2$ to determine that the control voltage $V_{cnt}$ is within the range $S_L$ shown in FIG. 4. Thus, the voltage comparator 8 outputs a signal $S_v$ having a value of "−1". This value is added to the value stored in the register 10 to be updated. Since the updated value is smaller than the last value, the additional current $I_{dac}$ outputted from the additional current generator 12 decreases. Therefore, the current inputted to the current control oscillator 14c also decreases, so that the frequency signal $F_{vco}$ serving as the output of the current control oscillator 14c also increases. This means that the F-V characteristic of the voltage control oscillator 14 varies from the graph $n_3$ to a graph $n_4$ as shown in FIG. 7(b). Thus, the control voltage $V_{cnt}$ corresponding to the target frequency $F_{tar}$ decreases. This operation is repeated until the control voltage $V_{cnt}$ enters the optimum oscillation range. Finally, the control voltage $V_{cnt}$ is stable when it reaches the optimum oscillation range. As can be seen from the foregoing, the voltage comparator 8, the register 10, and the additional current generator 12 constitute a characteristic control part for controlling the F-V characteristic of the voltage control oscillator 14.

As described above, according to the PLL circuit in this preferred embodiment, the control voltage is compared with a plurality of thresholds, and the F-V characteristic of the voltage control oscillator is caused to vary on the basis of the compared results. Therefore, the operating frequency range can be wider, and the gain of the voltage control oscillator hardly varies, so that it is possible to inhibit the frequency variation due to noises.

Figure 8:
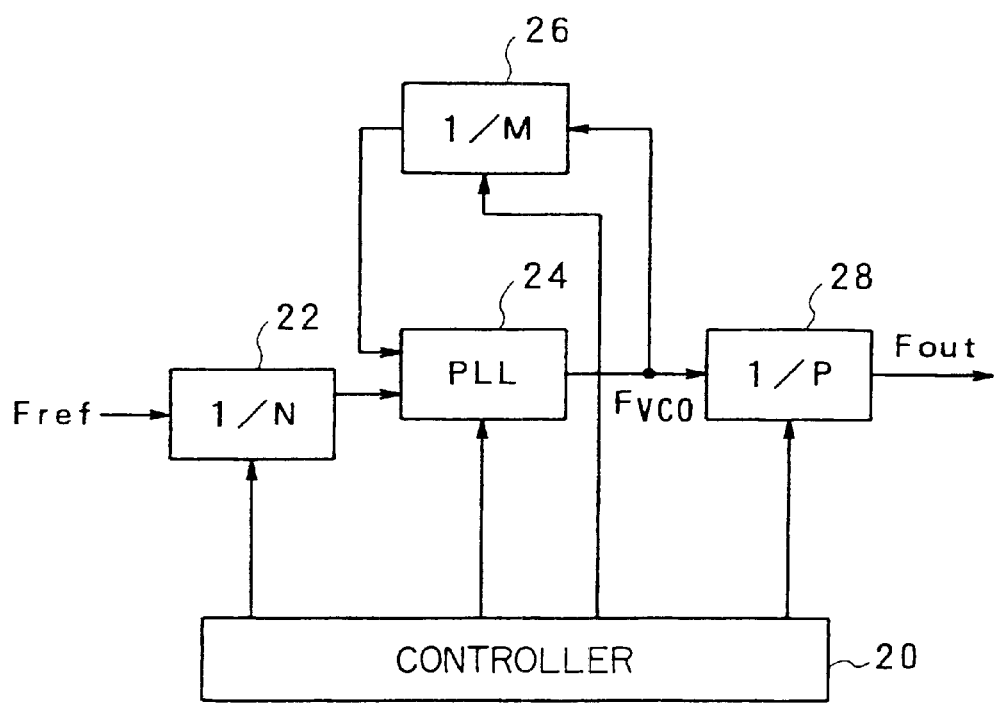
FIG. 8 is a block diagram of a synthesizer using a PLL circuit according to the present invention.

Referring to FIG. 8, a frequency synthesizer, to which the preferred embodiment of a PLL circuit according to the present invention is applied, will be described below.

This frequency synthesizer serves to obtain a plurality of stable frequencies from a reference frequency $F_{ref}$. The frequency synthesizer comprises a controller 20, frequency dividers 22, 26, 28, and a PLL circuit 24.

The PLL circuit 24 has the same construction as that in the above described preferred embodiment shown in FIG. 1. The frequency divider 22 divides the reference frequency $F_{ref}$ into 1/N frequencies, and the divided frequencies are used as reference inputs to the PLL circuit. The frequency divider 26 divides the output frequency $F_{vco}$ of the PLL circuit into 1/M frequencies as inputs to the PLL circuit 24. The frequency divider 28 outputs a clock of a frequency $F_{out}$ which is obtained by dividing the output frequency $F_{vco}$ of the PLL circuit into 1/P frequencies.

Therefore, the frequency $F_{out}$ is as follows.

$$F_{out} = (M / (N \cdot P)) \cdot F_{ref}$$

In the frequency synthesizer with the above described construction, if a value expected to be most suitable for the stable oscillation of the output clock $F_{out}$ is given to the register 10 as an initial value, it is possible to obtain a desired output clock $F_{out}$ rapidly after the dividing ratios of the frequency dividers 22, 26 and 28 are changed.

As described above, according to the present invention, it is possible to widen the operating frequency range, and it is possible to inhibit the frequency variation due to noises.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A PLL circuit comprising:
  a phase comparator for comparing the phase of an input signal with the phase of a reference input signal to output a signal according to the phase difference therebetween;
  a low pass filter for outputting a low frequency control voltage on the basis of the output of said phase comparator;
  a voltage control oscillator for controlling an oscillating frequency on the basis of said control voltage; and
  a characteristic control part for controlling the characteristic of oscillating frequency to control voltage of said voltage control oscillator on the basis of n+1 ranges of first through n+1-th ranges obtained by dividing a variable range of said control voltage by first through n-th ($n \geq 2$) thresholds which are different from each other.

2. A PLL circuit as set forth in claim 1, wherein said characteristic control part comprises:
  a voltage comparator for determining which range of said first through n+1-th ranges said control voltage belongs to, by comparing said control voltage with said first through n-th thresholds; and
  an additional current generating part for generating an additional current on the basis of the output of said voltage comparator,
  wherein said characteristic of said voltage control oscillator is controlled on the basis of said additional current.

3. A PLL circuit as set forth in claim 2, wherein said voltage control oscillator comprises:
  a voltage-to-current converter for converting said control voltage to a current; and
  a current control oscillator for controlling said oscillating frequency on the basis of the sum of the output of said voltage-to-current converter and said additional current.

4. A PLL circuit as set forth in claim 2, wherein the number n of said thresholds is 2, and said first threshold is lower than said second threshold, and
  wherein said voltage comparator performs the analog-to-digital conversion of the output of said low pass filter, said voltage comparator outputting a signal having a value of "−1" when the AD converted control voltage is lower than said first threshold and belongs to said first range, a signal having a value of "0" when the AD converted control voltage is not lower than said first threshold and lower than said second threshold and belongs to said second range, and a signal having a value of "1" when the AD converted control voltage is higher than said second threshold and belongs to said third range.

5. A PLL circuit as set forth in claim 4, wherein said additional current generating part has a memory for adding the output of said voltage comparator to a value stored therein, to update the added result to output the updated value as a code, said additional current generating part generating said additional current on the basis of said code outputted from said memory.

6. A PLL circuit as set forth in claim 5, wherein said voltage control oscillator comprises:
  a voltage-to-current converter for converting said control voltage to a current; and
  a current control oscillator for controlling said oscillating frequency on the basis of the sum of the output of said voltage-to-current converter and said additional current.

* * * * *